(12) United States Patent
Bootland et al.

(10) Patent No.: US 12,290,794 B2
(45) Date of Patent: May 6, 2025

(54) LAYERED SORBENT STRUCTURES (71) Applicant: JOHNSON MATTHEY PUBLIC LIMITED COMPANY, London (GB)

(72) Inventors: Alan Bootland, Billingham (GB); David Davis, Billingham (GB); Jonathan Edgar, Billingham (GB); Jonathon Higgins, Billingham (GB)

(73) Assignee: Johnson Matthey Public Limited Company, London (GB)

( * ) Notice: Subject to any disclaimer, the term of this patent is extended or adjusted under 35 U.S.C. 154(b) by 783 days.

(21) Appl. No.: 17/594,241

(22) PCT Filed: Jun. 5, 2020

(86) PCT No.: PCT/GB2020/051359
§ 371 (c)(1),
(2) Date: Oct. 7, 2021

(87) PCT Pub. No.: WO2020/260855
PCT Pub. Date: Dec. 30, 2020

(65) Prior Publication Data
US 2022/0176345 A1   Jun. 9, 2022

(30) Foreign Application Priority Data

Jun. 27, 2019 (GB) .................... 1909269

(51) Int. Cl.
*B01J 20/26* (2006.01)
*B01J 20/08* (2006.01)
(Continued)

(52) U.S. Cl.
CPC ............ *B01J 20/261* (2013.01); *B01J 20/08* (2013.01); *B01J 20/103* (2013.01); *B01J 20/18* (2013.01);
(Continued)

(58) Field of Classification Search
CPC .......... B01D 15/00; B01D 53/00; B01J 20/02; B01J 20/041; B01J 20/06; B01J 20/08;
(Continued)

(56) References Cited

U.S. PATENT DOCUMENTS 4,559,471 A   12/1985   Kroontje
5,888,925 A    3/1999   Smith et al.
(Continued)

FOREIGN PATENT DOCUMENTS

CN   109603746 A   4/2019
CN   109665857 A   6/2021
(Continued)

OTHER PUBLICATIONS

Maines, E. et al., 2020, Solid Freeform Fabrication 2018: Proceedings of the 29th Annual International Solid Freeform Fabrication Symposium—An Additive Manufacturing Conference, pp. 932-946. (Year: 2020).*

*Primary Examiner* — Brian A McCaig
(74) *Attorney, Agent, or Firm* — BakerHostetler (57) ABSTRACT

A shaped sorbent is described comprising a plurality of layers of photopolymerised resin containing particles of a sorbent material. The shaped sorbent may be used as a getter for use in gettering one or more contaminants in a sealed enclosure.

15 Claims, 3 Drawing Sheets

(51) Int. Cl.

| | |
|---|---|
| *B01J 20/10* | (2006.01) |
| *B01J 20/18* | (2006.01) |
| *B01J 20/30* | (2006.01) |
| *B29C 64/124* | (2017.01) |
| *B29C 64/286* | (2017.01) |
| *B33Y 70/00* | (2020.01) |
| *B33Y 80/00* | (2015.01) |
| B29K 33/00 | (2006.01) |
| B29K 105/00 | (2006.01) |
| B29L 31/00 | (2006.01) |
| B33Y 10/00 | (2015.01) |

(52) U.S. Cl.
CPC .............. *B01J 20/30* (2013.01); *B29C 64/124* (2017.08); *B29C 64/286* (2017.08); *B33Y 70/00* (2014.12); *B33Y 80/00* (2014.12); *B29K 2033/08* (2013.01); *B29K 2105/0002* (2013.01); *B29K 2105/0094* (2013.01); *B29K 2995/0097* (2013.01); *B29L 2031/737* (2013.01); *B33Y 10/00* (2014.12)

(58) Field of Classification Search
CPC . B01J 20/103; B01J 20/18; B01J 20/22; B01J 20/261; B01J 20/265; B01J 20/28026; B01J 20/28042; B01J 20/28052; B01J 20/30; B01J 20/3085; B29C 64/00; B29C 64/124; B29C 64/286; B29C 67/00; B29K 2033/08; B29K 2105/0002; B29K 2105/0094; B29K 2995/0097; B33Y 10/00; B33Y 70/00; B33Y 80/00
See application file for complete search history.

(56) References Cited

U.S. PATENT DOCUMENTS

| | | | |
|---|---|---|---|
| 6,200,494 B1 | 3/2001 | Manini et al. | |
| 6,428,612 B1 | 8/2002 | McPhilmy et al. | |
| 6,833,668 B1 | 12/2004 | Yamada et al. | |
| 2005/0260396 A1 | 11/2005 | Taylor et al. | |
| 2011/0206569 A1 | 8/2011 | Rohde et al. | |
| 2012/0048453 A1* | 3/2012 | Ito | H01J 9/241 |
| | | | 156/182 |
| 2015/0179976 A1* | 6/2015 | Galand | H10K 50/844 |
| | | | 522/39 |
| 2017/0189897 A1 | 7/2017 | Coupland | |
| 2018/0169617 A1 | 6/2018 | Brody et al. | |
| 2019/0322881 A1* | 10/2019 | Chopra | C09D 11/12 |

FOREIGN PATENT DOCUMENTS

| | | | | |
|---|---|---|---|---|
| EP | 0774795 A2 | * | 5/1997 | ............ H01M 10/40 |
| EP | 1795964 A2 | * | 6/2007 | ............ G03F 7/027 |
| EP | 2835841 A1 | | 2/2015 | |
| KR | 20180046141 A | | 5/2018 | |
| WO | 98/06560 A1 | | 2/1998 | |
| WO | 02/43098 A1 | | 5/2002 | |
| WO | 2007/013119 A1 | | 2/2007 | |
| WO | 2012/032325 A1 | | 3/2012 | |
| WO | 2015/015221 A1 | | 2/2015 | |
| WO | 2016/145182 A1 | | 9/2016 | |
| WO | 2016/166523 A1 | | 10/2016 | |
| WO | 2016/166526 A1 | | 10/2016 | |
| WO | 2018112263 A1 | | 6/2018 | |
| WO | 2018143831 A1 | | 8/2018 | |
| WO | 2019099347 | | 5/2019 | |
| WO | 2021118459 A1 | | 6/2021 | |

\* cited by examiner

LAYERED SORBENT STRUCTURES

This invention relates to shaped sorbents and in particular to shaped getters.

Getters are adsorbent compositions often used within a sealed enclosure forming part of, or a housing for, the electrical or electronic device, to remove unwanted materials from the atmosphere within the enclosure.

Getter compositions are known. For example, U.S. Pat. No. 6,428,612 discloses a hydrogen getter comprising a particulate zeolite having a portion of its sodium ions exchanged by an activated metal such as silver. The getter is provided in a flexible hydrogen permeable, moisture-impermeable sheet material in combination with a moisture absorber. U.S. Pat. No. 5,888,925 describes a getter comprising effective amounts of an oxide of a platinum group metal, a desiccant, and a gas permeable binder which preferably is cured after composition in an oxygen-bearing environment at about 150 to about 205 degrees centigrade. U.S. Pat. No. 4,559,471 describes the use of getter auxiliary means for decomposition of hydrocarbons within an evacuated apparatus in which the getter auxiliary means comprises an inorganic porous carrier charged with one or more of rhodium, copper, platinum, palladium and their oxides. U.S. Pat. No. 6,200,494 describes a combination of getter materials comprising a mixture of an oxide of a transition metal, metallic palladium and a moisture absorbing material. Getters for moisture are also known. WO02/43098 describes a getter for use in a sealed enclosure, in the form of a porous body formed from particles of a FAU zeolite having a silica to alumina molar ratio below 10 and particles of a high silica to alumina molar ratio zeolite, having a silica to alumina molar ratio of at least 20, bound together with an inorganic binder. WO2015/015221 discloses a getter composition suitable for gettering hydrogen and moisture comprising an alkaline earth metal oxide, or precursor thereto, and a transition metal oxide, or a precursor thereof, wherein said transition metal is selected from copper, nickel and cobalt.

Whilst the getter compositions of the prior art are useful in many applications, there are limitations placed on them by the limited shapes that may be achieved using conventional methods.

Additive-Layer Manufacture (ALM), also known as 3-dimensional (3D) printing, is an evolving technology that offers the ability to create new shapes. WO2012/032325 discloses a method for producing a catalyst using an additive layer method comprising: (i) forming a layer of a powdered catalyst or catalyst support material, (ii) binding or fusing the powder in said layer according to a predetermined pattern, (iii) repeating (i) and (ii) layer upon layer to form a shaped unit, and (iv) optionally applying a catalytic material to said shaped unit. However, the strength of shaped adsorbents made using powder-based methods is inadequate for preparing getters.

The Applicants have found that photopolymerisation additive-layer manufacture surprisingly offers a means to prepare new sorbents whose shape is not dictated by the conventional shaping techniques.

Accordingly, the invention provides a shaped sorbent comprising a plurality of layers of photopolymerised resin containing particles of a sorbent material.

The invention further provides a method for making a shaped sorbent comprising the steps of (i) combining a sorbent material with a photopolymer to form a sorbent mixture, and (ii) using photopolymerisation to form a shaped sorbent comprising a plurality of layers of photopolymerised resin containing particles of the sorbent material.

The invention further provides the use of a shaped sorbent comprising a plurality of layers of photopolymerised resin containing particles of a sorbent material as a getter.

By the term "sorbent" we include adsorbent and absorbent.

The sorbent material may be any adsorbent or absorbent material, i.e. any material used as a sorbent to remove substances. The sorbent may comprise alumina, silica, carbon, a mixture of two or more of these, or any other suitable sorbent materials. The sorbent material may comprise a molecular sieve. The molecular sieve may be a zeolite material, such as a zeolite X, a zeolite Y, ZSM-5, zeolite 13X, CBV500, a 3A zeolite, or a phosphate-containing molecular sieve such as an aluminium phosphate (ALPO) or silico-aluminium aluminium phosphate (SAPO), or any other molecular sieve material. Molecular sieves function at least in part by physically trapping the unwanted substance and so removing it from the environment. Alternatively, or in addition, the sorbent material may comprise a reactive sorbent, i.e. a sorbent material that chemically reacts with the unwanted substance. The reactive sorbent material may comprise one or more transition metal compounds, rare-earth metal compounds, alkali metal compounds or alkaline earth metal compounds. One or more of these compounds may be present. Suitable transition metal compounds include compounds of copper, zinc, cobalt, nickel, iron, platinum and palladium. Metal oxide and/or metal hydroxides are most suitable in the present invention.

The shaped sorbent may comprise both one or more molecular sieve sorbent materials and one or more reactive sorbent materials.

The maximum particle size (Dv100) of the sorbent material in the shaped sorbent is preferably less than the layer thickness, more preferably less than a half the layer thickness, most preferably less than a fifth of the layer thickness, especially less than a tenth of the layer thickness. For example, for a layer thickness of 10 µm, the maximum particle size may be in the range of 1 to 10 µm.

Similarly, for a 100 µm layer thickness, the maximum particle size may be in the range 10 to 100 µm. For layers with a thickness greater than 100 µm, the maximum particle size may be larger, but this is not necessary.

Particle sizes in the shaped sorbent may be determined using an X-ray microscope.

The shaped sorbent comprises a plurality of layers of photopolymerised resin. Each layer contains particles of a sorbent material. The Applicant has found that, surprisingly, a sorbent material, encapsulated within the plurality of layers of the photopolymerised resin is able to effectively capture substances in use, despite being contained within the resin.

Photopolymerisation, in general refers to the curing of liquid photo-reactive polymers (otherwise known as photopolymers) with ultraviolet or visible light or another form of electromagnetic radiation to form a photopolymerized resin. The liquid photo-reactive polymer reacts under the action of the light source, for example a UV light source, preferably having a wavelength in the range of about 375-405 nm, to form a rigid three-dimensional shape. The Applicant has found that photopolymerisation additive-layer manufacture based on photo-lithography is particularly suitable for fabricating the shaped sorbent. The most common photo-lithography-based technique is known as stereolithography (SLA) in which an ultraviolet laser is used to trace a two-dimensional image and so cure a layer of resin forming part of the desired overall shape, in a bath of liquid photopolymer. Once the trace is completed, the cured layer is immersed, for example by lowering a build platform on which the cured layer is supported, into the bath of the liquid photopolymer and then repeating the process. The process is repeated, layer-by-layer, until the desired shape has been formed. The photopolymerisation additive layer manufacturing technique generally uses a vat containing the liquid photopolymer and so the technique is sometimes referred to as vat photopolymerisation. A window may be provided in the base of the vat to allow the light source to be applied to the photopolymer from below. The laser is controlled by a computer in which the pre-determined design for the shape has been programmed. The shaped sorbent may suitably be designed using CAD-CAM software, which creates a three-dimensional computer model to be translated into the desired shape. The three-dimensional image is "cut" using the software into slices, where each slice is reconstructed through light-radiation curing of the liquid photopolymer, converting the image into a solid object. The computer and system are generally provided together as an SLA printer. SLA printers are available commercially.

A particularly suitable technique, similar to SLA, is known a digital light processing (DLP) and uses a projector to project the entire layer of the shaped sorbent through the window in the base of the reservoir onto the photopolymer rather than trace a laser beam. This reduces the time required to form the layer and allows the build platform to be raised or lowered. A non-stick layer may be provided on the window to allow removal of the shaped unit. Suitable materials include polydimethylsiloxane (PDMS) films or fluorinated ethylene polymer (FEP) films. A particularly suitable FEP film has a thickness of 0.25 m mm. A method, known as continuous liquid interface production (CLIP) or digital light synthesis (DLS), is based on DLP, but rather than physically separate the cured layer from the liquid photopolymer using a non-stick polymer, CLIP creates an oxygen-containing zone in which a thin uncured liquid layer is formed at the build point, which avoids adhesion of the shaped unit to the window. The platform may either be lowered from the cured layer, or the cured layer may be raised from the pool of liquid using a build support plate. This approach eliminates the separate steps required for the traditional SLA or DLP printer and reduces the time for fabrication of the layered structure. Descriptions of photopolymerisation processes and equipment may be found in "*Additive Manufacturing Technologies—Rapid Prototyping to Direct Digital Manufacturing*" by Ian Gibson, David W. Rosen and Brent Stucker, Spring (2010). CLIP is described in more detail by Tumblestone, et al in *Science,* 347 (2015) pages 1349-1352.

Other additive layer manufacturing techniques may be used, such as material jetting. Material jetting is based on the principle of a conventional ink-jet printer but uses light-curable resins in place of the conventional inks. Two-resists are used—a build material and a support material. The support material is subsequently removed after the shape has been formed. Because of this extra complexity and the constraints on the physical properties of the sorbent mixture because of the need for jetting, material jetting is less-preferred that the digital light processing and continuous liquid interface production or digital light synthesis methods.

Preferably, the shaped sorbent is subjected to a post-shaping treatment to ensure complete reaction, such as placing the shaped sorbent into a UV chamber to complete the curing process.

The photopolymer used in the present invention may be any suitable liquid photopolymer that hardens or cures when exposed to light in the ultraviolet or visible region of the electromagnetic spectrum. Most commonly, photopolymerised systems are typically cured through UV radiation, since ultraviolet light is more energetic; however, the development of dye-based photoinitiator systems have allowed for the use of visible light, having potential advantages of processes that are safer to handle. Often, a photopolymer comprises a mixture of monomers, oligomers, and photoinitiators that form into a hardened polymeric material through a process called curing. Typically, a photopolymer comprises a mixture of multifunctional monomers and oligomers in order to achieve the desired physical properties, and therefore a wide variety of monomers and oligomers have been developed that can polymerise in the presence of light either through internal or external initiation. The properties of a photocured material, such as flexibility, adhesion, and chemical resistance are provided by the functionalized oligomers present in the photocurable composite. Oligomers are typically epoxides, urethanes, polyethers, or polyesters, each of which provide specific properties to the resulting material. Each of these oligomers are typically functionalized by an acrylate. The curing forms what is known as a network polymer. Often the photopolymer will contain a photoinitiator. Photoinitiators are compounds that upon radiation of light decompose into reactive species that activate polymerisation of specific functional groups on the oligomers. There are two general routes for photoinitiation: free radical and ionic, either of which may be used. Whereas electron-beam curing is possible for reactive oligomers and monomers without photoinitiators, this method is less preferred.

Suitable photopolymers may include acrylate oligomers, which may be used in combination with a wide variety of reactive monomers or other oligomers and photo-initiators to create the photopolymerised resins. The photopolymers should possess sufficient cross-linking and should ideally be designed to have a minimal volume shrinkage upon polymerisation in order to avoid distortion of the shaped sorbent. Common monomers utilised for imaging include multifunctional acrylates and methacrylates, often combined with a non-polymeric component in order to reduce volume shrinkage. A competing composite mixture of epoxide resins with cationic photoinitiators is becoming increasingly used since their volume shrinkage upon ring-opening polymerisation is significantly below those of acrylates and methacrylates. Free-radical and cationic polymerisations composed of both epoxide and acrylate monomers may also be used, providing the high rate of polymerisation from the acrylic monomer, and better mechanical properties from the epoxy matrix. Suitable photopolymers are available commercially.

If desired, light blocking compounds, such as dyes, may be included in the sorbent mixture to alter the curing rate and assist in the shaping process.

The viscosity of the photopolymer for use in preparing the sorbent mixture and shaped sorbent is desirably in the range of 1 to 500 mPa·s at 20° C., preferably 1 to 250 mPa·s at 20° C., more preferably 1 to 100 mPa·s at 20° C.

The sorbent material is mixed with the photopolymer to form a liquid sorbent mixture that is cured to form the shaped sorbent. Accordingly, the method includes, (i) forming a sorbent mixture comprising a photopolymer and a sorbent material; (ii) exposing the sorbent mixture to electromagnetic radiation according to a predetermined pattern to form a layer of cured polymer; and (iii) repeating step (ii) layer upon layer to form a shaped product.

The amount of sorbent material in the sorbent mixture and shaped sorbent as prepared may be in the range of 1 to 70% by volume. Low levels in the range of 1 to 20% by volume may be effective for capturing low levels of contaminant over extended periods. Higher levels in the range 20 to 70% by volume, preferably 25 to 70% by volume have increased capacity. Above 70% by volume, the Applicant has found the viscosity of the mixture may be too high to enable rapid formation of the layered structure.

Determination of the volume percentage may be readily achieved from the weight and density of the sorbent material.

The Applicant has found that it is desirable to reduce the viscosity of the sorbent mixture by including a dispersant in the photopolymer mixture that disperses the particles of the sorbent material and improves the processing of the shaped sorbent. The dispersant may be any suitable dispersant, including anionic dispersants, cationic dispersants and non-ionic dispersants, that do not interfere with the curing process of the photopolymer.

The Applicant has found that the temperature of the sorbent mixture may be adjusted before and during shaping to lower the viscosity. The temperature of the sorbent mixture during the shaping process is preferably in the range 20 to 90° C., more preferably 35 to 90° C., most preferably 40 to 60° C.

Other means for reducing the viscosity of the sorbent mixture may be used, for example by including a lower viscosity inert liquid that is removed after curing.

The sorbent mixture desirably has a viscosity, at the temperature it is used, in the range of 1 to 20 mPa·s, preferably 1 to 10 mPa·s.

Pore formers may also be included to create porosity in the shaped sorbent.

The shaped sorbent comprises a plurality of layers. The number of layers in the shaped sorbent depends on the resolution of the photopolymerisation method and the size of the shaped sorbent but may, in a multi-layered structure, be in the range of 5 to 5000 or higher. The thickness of the layers in a shaped sorbent comprising a plurality of layers may be in the range 10 to 300 μm, but is preferably in the range 20 to 100 μm. SLA, DLP and CLIP techniques are particularly suitable for producing layered structures. Methods that provide concentric layers may also be used.

There is almost no limit to the geometry of the shaped sorbent that may be fabricated using the ALM technique. The shape may range from skeletal frame or multi-strut lattice structures, to multi-featured and facetted robust structures. For example, the shaped sorbent may be in the form of a wire-frame or skeletal framework structure containing a void space within and which may have multiple internal strengthening rods, or the shaped sorbent may be a honeycomb in any form or a solid unit, such as a cylinder, which may be configured with flat or domed ends, multiple lobes and/or through holes.

Lattice framework structures are preferred and may comprise one or more faces which may be circular or polygonal in shape.

The shaped sorbents may comprise one or more through holes, which may be circular, elipsoid or polygonal, e.g. triangular, square, rectangular or hexagonal, in cross section. The through holes may comprise two or more through holes running parallel, or non-parallel holes running through the shaped sorbent at various angles, to the longitudinal axis of the shaped sorbent. Through holes that are curved may also be produced using the ALM technique, which is currently not possible using conventional pelleting and extrusion techniques.

The shaped sorbent desirably has a high geometric surface area to maximise the surface area for sorption. For example, the shaped sorbent may have a cylindrical or three-dimensional ellipsoidal shape comprising through-holes, for example as disclosed in WO2016/166523 and WO2016/166526. A particularly suitable shaped sorbent is in the form of an open-ended cylinder containing a lattice structure or layers of spaced parallel struts or meshes. The cylinder suitably has an aspect ratio, i.e. length/diameter of ≤1, e.g. 0.10 to 0.75.

The shaped sorbent may have a cross-sectional size, either length width or height, in the range of from 0.3 mm to 100 mm, preferably 0.3 mm to 50 mm.

The shaped sorbent may further comprise lugs or tabs to enable it to be secured in use.

The shaped sorbent may alternatively be formed as a multi-channel monolith or honeycomb structure, which may have a width or length in the range of 10 cm to 250 cm.

The shaped sorbents may be used in processes to remove substances from gases, liquids or sealed enclosures, which may be under vacuum or contain an inert gas, such as nitrogen or argon. The shaped sorbents are thermally very stable, but gettering is typically carried out at temperatures in range of from 0 to 60° C. The present invention is of particular use in producing a shaped getter for removing one or more unwanted substances from a sealed enclosure, especially a hermetically-sealed enclosure. The shaped sorbent may be used to remove one or more of water vapour, carbon monoxide, carbon dioxide, hydrogen sulphide, hydrogen chloride, oxygen, ammonia, hydrogen, organic molecules such as methanol or ethanol or hydrocarbons such as methane, ethane or ethylene. The shaped sorbents are particularly useful for removing water vapour and hydrogen. The invention therefore includes a process for the removal of a substance from an environment by contacting the environment with a shaped sorbent comprising one or more layers of photopolymerized resin containing particles of a sorbent material.

The invention will now be further described by reference to the following examples and figures in which.

EXAMPLE 1. PREPARATION OF SHAPED ZEOLITE SORBENTS BY DIGITAL LIGHT PROCESSING

Materials and Equipment

Sorbent materials: 3A Zeolite powder and PdO powder (both commercially available).

Photopolymer: CPS2030. CPS2030 is a formulated commercially available product that contains a photoinitiator and polymer precursors. The photopolymer viscosity at 20° C. was 30 mPa·s. This photopolymer is available from Colorado Photopolymer Solutions.

Dispersant: Hypermer™ KD1 is a cationic polymeric dispersant. This material is available from Croda™.

Computer-aided design equipment: A desktop computer running "Blender" open-source software followed by refinement of the structure using "Element" software available from nTopology.

Figure 1:
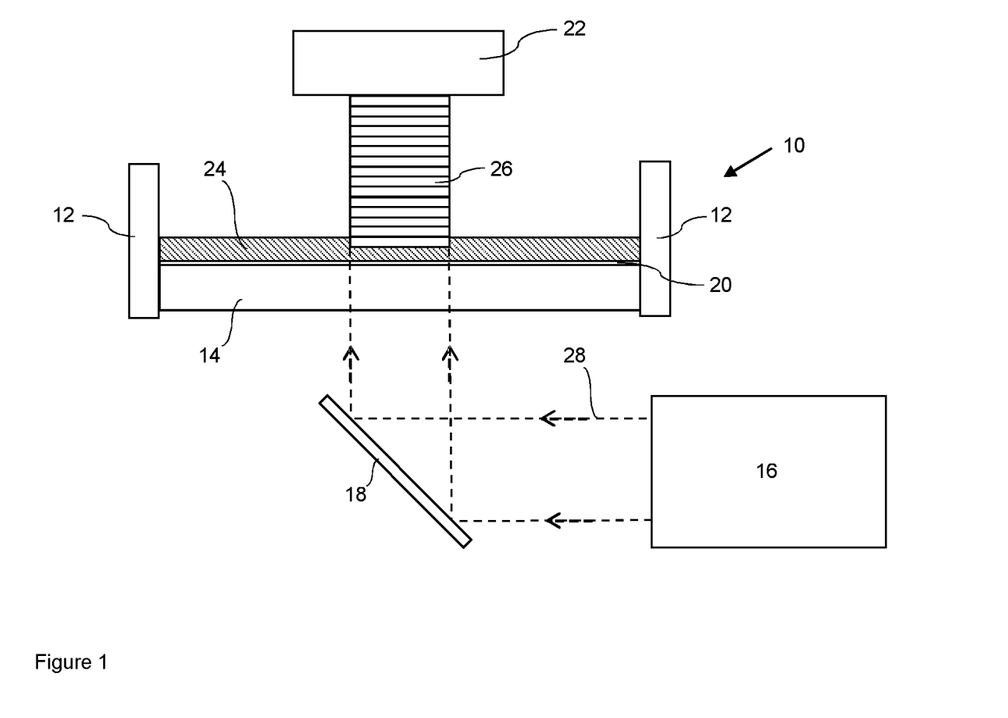
FIG. 1 is a depiction of vat photopolymerisation additive-layer manufacture (VP-ALM) equipment used to prepare shaped sorbents.

DLP printer equipment: Moonray™ S available from Sprintray Inc. The equipment is depicted in FIG. 1. The equipment comprises a computer control unit (not shown) that controls the equipment, a vat or reservoir 10 for the sorbent mixture comprising a wall 12 and a glass window 14 at its base to allow light from a computer-controlled digital light processor 16 to be projected using a mirror 18 onto the underside of the glass window 14. The reservoir-side of the glass window has a non-stick polymer film 20 placed on it to permit detachment of cured material. A build platform 22 is placed in the liquid sorbent mixture 24 such that there is a layer of liquid between the lower face of the build platform 22 and the non-stick polymer film 20. Once a cured layer 26 has been formed, the platform 22 and vat 10 are separated by a layer thickness and the process repeated. The Moonray™ S is able to produce a layer thickness of 20, 50, or 100 µm.

Sorbent mixture preparation: 65% by weight Zeolite 3A in CPS2030/Hypermer™ KD1.

98 g of CPS2030 was weighed out and warmed to 50° C. Hypermer™ KD1 was warmed to 50° C. to ensure that it was liquid before adding to the warmed CPS2030 resin. 2 g of Hypermer™ KD1 was added to 98 g of CPS2030 and mixed in a Hauschild Speedmixer™ at 2000 rpm for 180 s. 153.29 g of 3A zeolite was weighed and placed into a Speedmixer™ pot. 88.2 g of the previously prepared 2% Hypermer™ KD1 in CPS2030 resin solution was warmed to 50° C. and weighed into the Speedmixer™ pot with the powder. The mixture was then placed into the Speedmixer™ and mixed at 1200 rpm for 180 s. After mixing any residue of powder was returned from the sides of the container and mixed into the bulk mixture. The mixture was then mixed again at 1200 rpm for 180 s in the Speedmixer™. Following this mixing procedure, the sorbent mixture was poured into the resin tank of the Moonray™ S DLP equipment ready to produce shaped parts.

The zeolite 3A was not pre-dried and so contained adsorbed water. For these examples, the moisture content (determined by measuring mass loss on heating to 300° C. for 8 hours) was 18.4% by weight.

DLP Printer Preparation

Methods and software are available commercially from the DLP printer providers or open-source. The method used here was as follows:
1. Draw/Create a structure design using computer-aided design (CAD) software.
2. Import the structure design into the DLP printer equipment software for positioning on the virtual build platform and generation of automatic support structures.
3. Generate a slice file in which the design is divided up into a plurality of layers.
4. Send the slice file to the DLP printer equipment (it is necessary to ensure at this point that there is sorbent material mixture in the vat and the build platform is fixed if required).

The CPS2030 photopolymer solidifies upon exposure to 405 nm wavelength light. The power output of the Moonray™ S at the curing surface was 2.8 mWcm$^{-2}$ and was calibrated for a peak wavelength of 405 nm. Prior to forming the shaped sorbents, a working curve was determined to identify the exposure to the light source required to produce the desired resolution by exposing the photopolymer to a known amount of energy and then measuring the thickness of the solidified polymer. A description of photopolymerisation including how to determine the working curve may be found in "*Additive Manufacturing Technologies—Rapid Prototyping to Direct Digital Manufacturing*" by Ian Gibson, David W. Rosen and Brent Stucker, Spring (2010), pages 61-102.

Shaped Sorbent Production

Referring again to FIG. 1, the reservoir 10 was loaded with the sorbent mixture 24 and the build platform 22 securely fastened. A non-stick FEP polymer film 20 was placed on the glass window 14. The pre-prepared slice file was then processed using the DLP equipment. Light 28 at a peak wavelength of 405 nm from the digital light processor 16 was projected through the glass window 14 into the layer of liquid in a pattern according to the first layer of the shaped sorbent, thereby causing it to solidify. The light projected is depicted in FIG. 1 by the dotted lines. The reservoir 10 was then lowered or the build platform 22 raised to allow the liquid to flow in between the cured solidified layer and the non-stick polymer film 20 and then their position adjusted to one layer thickness and the process repeated using a pattern according to a second layer of the shaped sorbent, and so on, building up the layers 26 until the fully-formed shaped sorbent was realised. The layer thickness in this example was 100 µm.

Sample Cleaning and After-Treatment

The shaped sorbent was removed from the build platform and washed with isopropanol to remove unreacted material. The washed shaped sorbent was then placed in a UV curing chamber and post-treated at 375-405 nm to fully cure the polymer.

Figure 2:
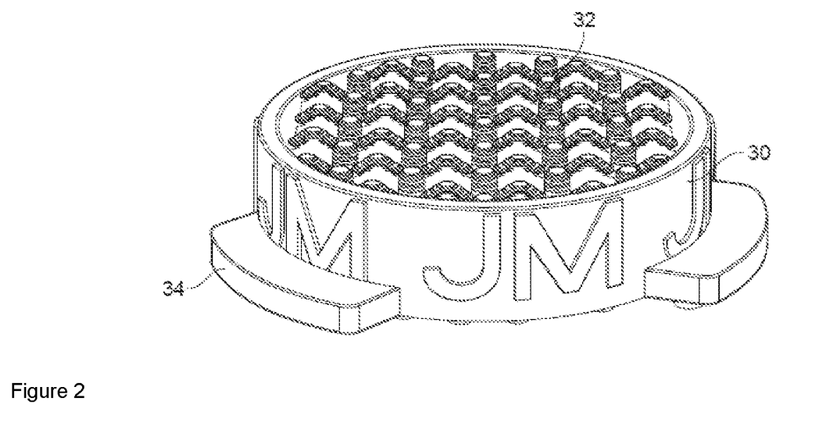
FIG. 2 is a side-view of a shaped getter prepared using the equipment.
Figure 3:
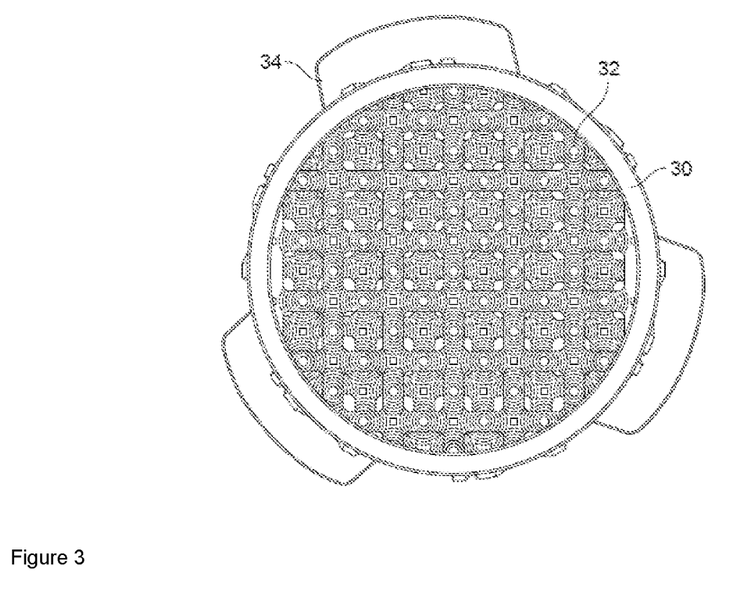
FIG. 3 is a top view of the same shaped sorbent.
Figure 4:
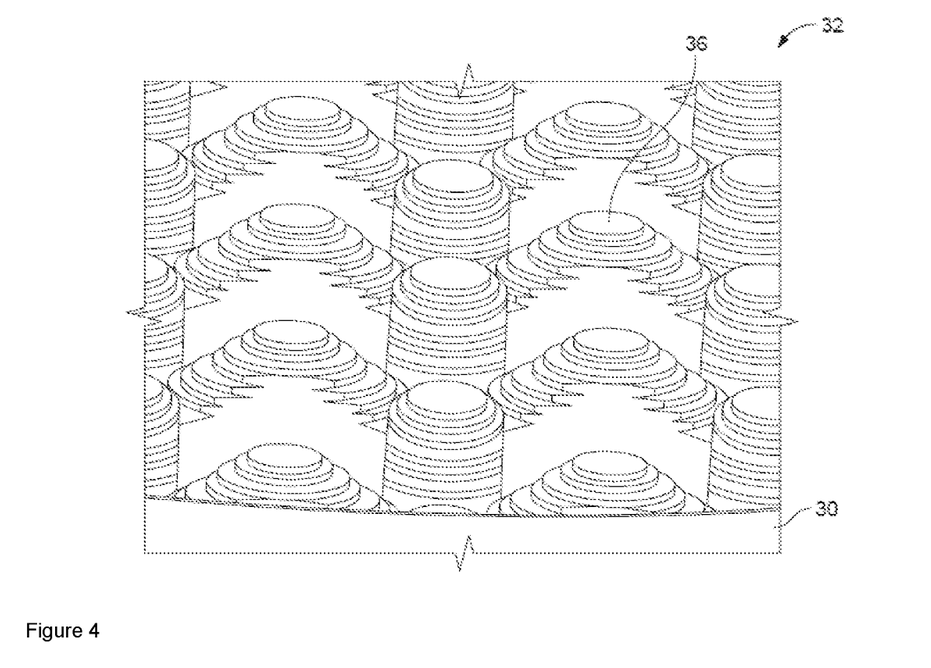
FIG. 4 is an enlarged portion of FIG. 1 depicting the layers in the shaped sorbent.

The shaped sorbent is depicted in FIGS. 2, 3 and 4.

The shaped sorbent depicted in FIGS. 2 and 3 comprises and open cylinder structure 30 comprising an internal lattice structure 32 comprising parallel struts. Three equally-spaced lugs 34 were provided on the periphery of the cylinder at one end to enable attachment of the shaped sorbent within a device or sealed enclosure. The cylinder had a diameter of 20 mm. The height of the cylinder was 5 mm (and so L/D was 0.25). The lugs 34 were 2.75 mm wide with a height of 1.25 mm. The strut thickness in the lattice structure was 0.8 mm. FIG. 4 depicts an enlarged section of FIG. 2 showing the lattice structure 32 to comprise multiple layers 36. The number of layers in this shaped sorbent was 50.

EXAMPLE 2. TESTING BY DYNAMIC VAPOUR SORPTION (DVS)

Tests were performed on a cured sorbent mixture comprising 65% wt Zeolite 3A in 2% wt Hypermer™ KD1/CPS2030 photopolymer as prepared in Example 1. Samples for testing were prepared by casting the liquid sorbent mixture onto a FEP-covered glass slide and exposing the resulting layer to a 405 nm light source. Cured shaped sorbent samples having thicknesses in the range of 0.3 to 1 mm were prepared. The cured samples were then broken up to form flakes of material to fit the 9 mm sample holder for the DVS testing.

Moisture adsorption was determined using the following procedure using Surface Measurement Systems DVS Advantage™ apparatus. Each sample was pre-heated at 120° C. for 6 hours to record the dehydrated sample mass. Adsorption of moisture was then measured by mass change of the sample exposed to a nitrogen flow of 200 cm$^3$/minute containing 40% relative humidity at 20° C. for 480 minutes. The results were as follows:

| Sample | Thickness (mm) | Moisture adsorption (% wt) |
|---|---|---|
| CPS2030 Polymer no zeolite | 1.00 | 0.94 |
| Cured Sorbent—2 s Exposure | 0.30 | 10.64 |
| Cured Sorbent—5 s Exposure | 0.75 | 4.41 |
| Cured sorbent—10 s Exposure | 0.89 | 3.38 |

The results indicate that the thin photopolymerised samples containing the zeolite are more able to capture water vapour.

It should be noted that the photopolymerised samples are not saturated at the end of the test period (8 hours). A further measurement performed to 16 hours showed a sample to continue to adsorb moisture at a steady rate, achieving a pick-up of 14.3 wt. %.

EXAMPLE 3. PREPARATION OF SHAPED PDO/ZEOLITE SORBENTS BY DIGITAL LIGHT PROCESSING

Samples of a shaped sorbent were prepared using the casting method of Example 2 to test whether a hydrogen-gettering shaped sorbent could be produced. Sorbent mixtures were prepared by mixing 5% wt or 10% wt PdO powder (sieved to <45 μm) into the 65% wt Zeolite 3A in 2% wt Hypermer™ KD1/CPS2030 photopolymer sorbent mixture as prepared in Example 1, before shaping.

Hydrogen uptake of samples was then measured using a Chemisorb 2480 volumetric chemisorption analyser. Accurately weighed aliquots of approximately 0.5-1 g of material were used. Activation of the sample was achieved by flowing compressed air through the sample at 50 cm$^3$ per minute and heating from ambient to 120° C. at 10° C. per minute followed by holding at this temperature for 2 hours. At the end of this period, the compressed air was switched off and the sample opened to vacuum whilst cooling to the analysis temperature of 35° C. and a pressure of less than 10 μmHg. When these conditions were met, the sample was held under vacuum for a further 60 minutes. The uptake of pure hydrogen was measured at 100, 150, 200, 300, 400, 500, 600, 700 and 760 mmHg using an equilibration time of 10 seconds to generate an equilibrium isotherm. Using the post measurement sample weight, the total gas uptake was reported as cm$^3$/g at 760 mmHg. The results were as follows:

| PdO Loading (% wt) | 3A Zeolite Loading (% wt) | Hydrogen Capacity (cm$^3 \cdot$ g$^{-1}$) | Thickness (μm) |
|---|---|---|---|
| 5 | 65 | 1.8 | 150 |
| 10 | 65 | 3.9 | 150 |

The shaped sorbents were able to adsorb hydrogen in the test.

EXAMPLE 4. PREPARATION OF SHAPED ZEOLITE SORBENTS BY DIGITAL LIGHT PROCESSING

Materials and Equipment.
Sorbent materials: 3A Zeolite powder.

Photo-polymer: Genesis Flexible Development Base Resin is a commercially available photocurable resin that is composed of acrylated monomers/oligomers (urethane acrylate resin and urethane acrylate), dispersant, and photoinitiator. The photo-polymer viscosity at 20° C. is 45 mPa·s. This photo-polymer was supplied and used as received from Tethon Corporation Inc.

Computer-aided design equipment: A desktop computer running "Blender" open-source software followed by refinement of the structure using "Element" software available from nTopology.

Vat photo-polymerisation additive-layer manufacture (VP-ALM) equipment: Bison 1000 DLP available from Tethon Corporation Inc. The equipment is similar to that depicted in FIG. 1. The equipment comprises a computer control unit that controls the equipment, a vat or reservoir for liquid photo-polymer or adsorbent mixture having a thin, transparent polymer window at its base to allow light from a computer-controlled digital light processor light source to be projected using a mirror onto the liquid layer at the bottom of the reservoir. The transparent polymer window is non-stick to permit detachment of the layers of cured material. A build platform is placed in the liquid photo-polymer or adsorbent mixture such that there is a layer of liquid between the lower face of the build platform and the non-stick polymer film.

Sorbent mixture preparation: 65% by weight Zeolite 3A in Genesis Flexible Development Base Resin. 50.67 g of 3A zeolite was weighed out and placed into a Hauschild Speedmixer™ pot. 27.28 g of the Genesis Flexible Development Base Resin was weighed into the Speedmixer pot with the 3A zeolite. The mixture was then placed into the Hauschild Speedmixer™ and mixed at 2000 rpm for 60 s. After mixing any residue of powder was returned from the sides of the container and mixed into the bulk mixture. The mixture was then mixed a further three times at 3000 rpm for 60 s in the Speedmixer™.

The zeolite 3A was not pre-dried and so contained adsorbed water. For this example, the moisture content (determined by measuring mass loss on heating to 300° C. for 8 hours) was 18.4% by weight.

Following this mixing procedure, the sorbent mixture was poured into the resin tank of the Bison 1000 DLP equipment ready to produce shaped parts.

DLP Printer Preparation

Methods and software are available commercially from the DLP printer providers or open-source. The method used here was as follows:
1. Draw/Create a structure design using computer-aided design (CAD) software.
2. Import the structure design into the DLP printer equipment software for positioning on the virtual build platform and generation of automatic support structures.
3. Generate a slice file in which the design is divided up into a plurality of layers.
4. Send the slice file to the DLP printer equipment (it is necessary to ensure at this point that there is sorbent material mixture in the vat and the build platform is fixed if required).

The Genesis Flexible Development photopolymer solidifies upon exposure to 405 nm wavelength light. The Bison 1000 has a variable power light source. At the curing surface the power output is a minimum of 2.24 mW·cm$^{-2}$ and a maximum of 9.05 mW·cm$^{-2}$. This was calibrated for a peak wavelength of 405 nm.

Shaped Adsorbent Production

The fully assembled reservoir was loaded with adsorbent mixture without the build platform. The pre-prepared slice file was then processed using the DLP equipment. Light was projected through the windows into the layer of liquid from the digital light processor in a pattern according to the first layer of the shaped adsorbent, thereby causing it to solidify. The light switched off after a set exposure time and the process repeated using a pattern according to a second layer of the shaped adsorbent, and so on, building up the layers until the fully-formed shaped adsorbent was realized.

The number of exposures was determined by designing an input file that, when processed by the software into slices, gave shaped adsorbents of increasing thickness depending on the corresponding number of exposures. Each exposure was 5 s at the respective power setting.

The layer thickness for each exposure was determined by the material properties of the formulation and output power of the light projector.

Sample Cleaning and After-treatment

The shaped adsorbent was removed from the base of the reservoir and washed with isopropanol to remove unreacted adsorbent material. The washed shaped adsorbent was then placed in a UV curing chamber and post-treated at 375-405 nm to fully cure the polymer.

Squares of 1 cm×1 cm with thicknesses ranging between 1.0 and 1.5 mm were prepared by this method.

EXAMPLE 5. TESTING BY DYNAMIC VAPOUR SORPTION (DVS)

Tests were performed on sorbents comprising 65% wt Zeolite A in Genesis Flexible Development photo-polymer prepared by curing several thin films of the adsorbent mixture according to the procedure of Example 4. Cured shaped sorbent samples having thicknesses of 1.11 (5 layers) and 1.40 mm (10 layers) were used. The cured samples were then broken up to form flakes of material to fit the 9 mm sample holder for the DVS testing.

Moisture adsorption was determined using the following procedure using Surface Measurement Systems DVS Endeavour™ apparatus. Each sample was pre-heated at 120° C. for 6 hours to record the dehydrated sample mass. Adsorption of moisture was then measured by mass change of the sample exposed to a nitrogen flow of 40 cm$^3$/minute containing 40% relative humidity at 20° C. for 360 minutes. The results were as follows:

| Sample | Moisture adsorption (%) | Thickness (mm) |
|---|---|---|
| Cured Sorbent—5 × 5 s exposure (9.05 mW · cm$^{-2}$) | 5.66 | 1.11 |
| Cured Sorbent—10 × 5 s exposure (9.05 mW · cm$^{-2}$) | 4.09 | 1.40 |

The results indicate that the thin photopolymerised samples prepared using this photo-polymer are able to capture water vapour. The samples were able to pick up water more effectively than those of example 2, despite exposure to 40% RH being for a shorter period of time, and at a lower flow on the DVS equipment, and samples being thicker. This polymer is also flexible, which offers benefits in installation and use.

The invention claimed is:

1. A shaped sorbent comprising a plurality of layers of photopolymerised resin containing particles of a sorbent material, wherein the sorbent material comprises alumina, silica, carbon or a molecular sieve and the shaped sorbent is formed by additive layer photopolymerisation comprising digital light processing or continuous liquid interface production of a mixture of the sorbent material and a photopolymerisable resin, wherein each layer has a thickness in a range of from 10 to 300 μm and wherein the maximum particle size (Dv100) of the sorbent material in the shaped sorbent is less than the layer thickness.

2. The shaped sorbent according to claim 1 wherein the sorbent material comprises a reactive sorbent material.

3. The shaped sorbent according to claim 1 comprising a molecular sieve sorbent material and a reactive sorbent material.

4. The shaped sorbent according to claim 1 wherein the photopolymerised resin is derived from a photopolymer comprising a mixture of multifunctional monomers and oligomers functionalized by an acrylate.

5. The shaped sorbent according to claim 1 comprising from 1 to 70% by volume of sorbent material.

6. The shaped sorbent according to claim 1 comprising 5 to 5000 layers.

7. The shaped sorbent according to claim 1 wherein the shaped sorbent has a cross-sectional length width or height, in a range of from 0.3 mm to 100 mm.

8. The shaped sorbent according to claim 1 wherein the shaped sorbent is in the form of an open-ended cylinder containing a lattice structure or layers of spaced parallel struts or meshes.

9. A process for gettering by placing the shaped sorbent according to claim 1 in a sealed container.

10. The shaped sorbent according to claim 1 wherein the sorbent material comprises a zeolite material.

11. A method for making a shaped sorbent unit comprising the steps of (i) combining a sorbent material with a liquid photopolymer comprising a mixture of monomers, oligomers and photoinitiators to form a sorbent mixture, and (ii) using photopolymerisation to form a shaped sorbent comprising a plurality of layers of photopolymerised resin containing particles of the sorbent material, wherein the shaped sorbent is formed by additive layer photopolymerisation comprising digital light processing or continuous liquid interface production of a mixture of the sorbent material and a photopolymerisable resin, each layer has a thickness in the range of from 10 to 300 μm and the maximum particle size (Dv100) of the sorbent material in the shaped sorbent is less than the layer thickness.

12. The method according to claim 11 wherein the photopolymer has a viscosity in a range of from 1 to 500 mPa·s at 20° C.

13. The method according to claim 11 wherein the sorbent mixture comprises from 1 to 70% by volume of the sorbent material.

14. The method according to claim 11 wherein the sorbent mixture comprises a dispersant.

15. The method according to claim 11, wherein the sorbent material comprises alumina, silica, carbon or a molecular sieve.

* * * * *